(12) United States Patent
Bianchi et al.

(10) Patent No.: US 10,103,734 B2
(45) Date of Patent: Oct. 16, 2018

(54) LEVEL SHIFTER CIRCUIT, CORRESPONDING APPARATUS AND METHOD

(71) Applicant: STMicroelectronics S.R.L., Agrate Brianza (IT)

(72) Inventors: Dario Bianchi, Suzzara (IT); Federico Guanziroli, Lentate Sul Seveso (IT); Davide Ugo Ghisu, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 26 days.

(21) Appl. No.: 15/168,468

(22) Filed: May 31, 2016

(65) Prior Publication Data

US 2017/0149434 A1     May 25, 2017

(30) Foreign Application Priority Data

Nov. 24, 2015   (IT) .......................... 102015000076200

(51) Int. Cl.
  *H03L 5/00*       (2006.01)
  *H03K 19/0185*    (2006.01)
  *H03K 3/037*      (2006.01)

(52) U.S. Cl.
  CPC ..... *H03K 19/018507* (2013.01); *H03K 3/037* (2013.01)

(58) Field of Classification Search
  CPC ..... H03K 19/018521; H03K 3/356113; H03K 19/00315; H03K 17/102; H03K 3/012
  USPC ........................................................ 327/333
  See application file for complete search history.

(56) References Cited

U.S. PATENT DOCUMENTS

| | | | |
|---|---|---|---|
| 6,043,698 A | 3/2000 | Hill | |
| 8,044,699 B1 | 10/2011 | Kelly | |
| 8,149,017 B2 | 4/2012 | Knierim | |
| 8,686,784 B2 | 4/2014 | Wang | |
| 8,717,063 B2 | 5/2014 | Stirk et al. | |
| 2011/0037509 A1* | 2/2011 | Herzer | H03K 19/018521 327/333 |
| 2011/0115542 A1* | 5/2011 | Koike | H03K 19/018521 327/333 |
| 2014/0247082 A1 | 9/2014 | Gazit | |

FOREIGN PATENT DOCUMENTS

DE      103 57 495 A1    7/2005

* cited by examiner

*Primary Examiner* — Quan Tra
(74) *Attorney, Agent, or Firm* — Seed IP Law Group LLP

(57) ABSTRACT

A level shifter circuit includes: an input stage for receiving an input signal switchable between a first and a second input level and an output stage to produce a drive signal for the load that is switchable between a first and a second output level. A level translator translates the input signal switching between the input levels into the output stage switching between the output levels. A feedback element coupled to the output stage transfers to the input stage a feedback signal representative of the output level of the output stage. The input stage includes control circuitry sensitive to the input signal and the feedback signal for detecting undesired switching of the output stage between the first and second output levels occurring in the absence of input signal switching between the first and second input levels. The control circuitry inverts the output level of the output stage resulting from undesired switching.

18 Claims, 3 Drawing Sheets

LEVEL SHIFTER CIRCUIT, CORRESPONDING APPARATUS AND METHOD

BACKGROUND

Technical Field

The description relates to level shifter circuits. One or more embodiments may find use in a variety of applications such as e.g., in ultrasound open market products. A driving unit for ultrasound pulsers is exemplary of one such possible application.

Description of the Related Art

While capable of satisfactory performance, conventional level shifter circuits may exhibit various drawbacks, e.g.:
- slow transition due to parasitic capacitances of e.g., a HV MOS,
- possible appreciable static consumption,
- a high value pull-up resistor possibly needed to avoid high consumption,
- low immunity to undesired couplings e.g., in noisy environments (that is, noisy supply and noisy environments), and
- reduced robustness to possible data losses, which may lead to destructive events (e.g., undesired high output current).

BRIEF SUMMARY

According to one or more embodiments, a level shifter circuit may have the features set forth in the claims that follow.

One or more embodiments may also relate to a corresponding apparatus (e.g., an ultrasound product such as an ultrasound pulser) as well as to a corresponding method.

The claims form an integral part of the disclosure of one or more embodiments as provided herein.

One or more embodiments may provide e.g., a high-voltage level shifter including a feedback function, e.g., a capacitive feedback.

One or more embodiments may provide a high-voltage signal translator, possibly with a high difference between the low voltage domain—e.g., 3.3V—and the high voltage domain—e.g., >100V, with a high current and low quiescent consumption, adapted for use, e.g., in noisy power supply and fast transition applications.

One or more embodiments may be resistant to undesired couplings e.g., in noisy environments.

One or more embodiments may include a feedback system which checks the translated output data for consistency with the control input signal e.g., for refresh in case of a transition.

In one or more embodiments such a feedback system may include a capacitor to shift voltage level from the high voltage domain to the low voltage domain, and a logic control sensitive to the output signal e.g., to refresh the output signal.

One or more embodiments may offer one or more of the following advantages:
- high immunity to noisy power supplies and noisy environments,
- possible loss of data effectively prevented,
- fast transition, and
- reduced static consumption.

BRIEF DESCRIPTION OF THE DRAWINGS

One or more embodiments will now be described, by way of example only, with reference to the annexed figures, wherein.

DETAILED DESCRIPTION

Figure 1:
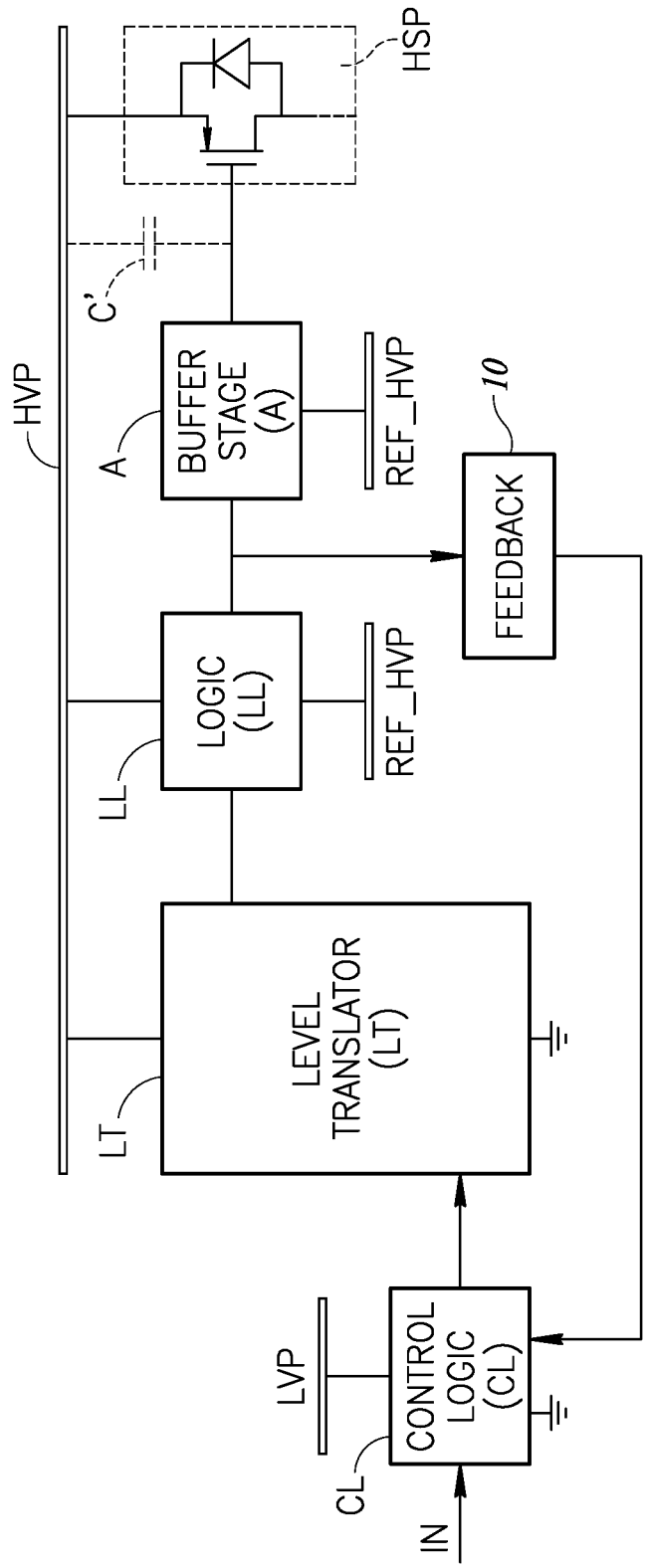
FIG. 1 is a block diagram exemplary of embodiments.

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

The disclosure refers to level shifter circuits for use e.g., in apparatus involving high voltages and high currents. Systems for controlling actuators with operating voltages up to 200V and currents of the order of a few amperes may be exemplary of such apparatus.

These systems may include communication interfaces in a low voltage domain (e.g., 1V-2V) and may drive high-voltage loads, so that a level shifter, capable of internally "translating" the signals from one domain to the other, may facilitate proper operation.

Level shifters (also known as level translators) may thus receive input data e.g., at a low voltage (e.g., with values GND=logic "0" or LVP=logic "1") and translate these data into high voltage output signals (e.g., signals "around" a high voltage such as e.g., REF_HVP=logic "0" or HVP=logic "1") consistently and unequivocally with respect to the input signal, that is by providing a correct relationship between input and output.

Correlation between these signals being lost may result, for example, in a MOS output being undesirably turned on when desired to be off. In the presence of e.g., a MOS output of large dimensions (that is, able to carry large currents), this may undesirably produce large currents potentially destructive to a device.

Achieving a desired correlation may be increasingly difficult as the voltage difference between the two domains (that is, low voltage—e.g., LVP—and high voltage—e.g., HVP).

An exemplary field of application is ultrasound pulsers, where an actuator may be driven with e.g., square waves with an amplitude up to 200V, with output fronts of the order of 20V/ns, and with switching currents of the order of 2 A. In certain applications many pulsers (e.g., sixteen pulsers) may be integrated, which involves quite significant switching currents (e.g., a few tens of amperes) and correspondingly highly noisy environments.

Large switching currents, large voltage dynamics and "fast" fronts that may appear on power supplies or internal nodes significant disturbances (to which the circuit must be immune) are thus significant factors for many applications.

Power consumption is another factor deserving consideration. Small currents consumed at high voltages may in fact significantly contribute to total power consumption. A reduced (notionally null) static consumption is thus a desirable feature of a level translator, being otherwise appreciated that reducing consumption may result in reduced noise immunity.

Various level shifter circuits are disclosed in documents such as e.g., US 2014/0247082 A1, U.S. Pat. No. 8,044,699 B2, U.S. Pat. No. 8,686,784 B2, or U.S. Pat. No. 8,717,063 B2.

As indicated, arrangements as disclosed in these documents may exhibit certain drawbacks such as e.g., a slow transition due to a high parasitic capacitance of high voltage device, a non-negligible static consumption, low immunity to noisy power supplies and the possibility to lose data.

The block diagram of FIG. 1 is exemplary of one or more embodiments of a level shifter circuit for driving an electrical load e.g., HSP.

In one or more embodiments this may occur via a stage A such as e.g., a buffer stage such as a series of logic gates.

A high-side pulser in an ultrasound product may be exemplary of such a load. It will be otherwise appreciated that the load (e.g., HSP) per se may not be part of embodiments.

In one or more embodiments, an input signal IN may be applied to a control logic CL, which in turn drives a level translator (level shifter) LT. The level translator LT drives the load HSP via a logic element LL (and possibly the stage A).

Merely by way of non-limiting example, a level shifter circuit as exemplified herein may operate between a low voltage (LVP) domain at e.g., 3.3V and a high voltage domain (HVP) at a voltage in excess of 100V.

It will otherwise be appreciated that, while located in the high voltage domain of the circuit, the logic element LL and the stage A may not be by themselves high-voltage elements: for instance they may be operating between HVP and a voltage REF_HVP with e.g., REF_HVP=HVP−3.3V.

In one or more embodiments, a feedback path 10 may be provided to transfer over an input line 20 to the control logic CL a signal representative of the output signal (e.g., logic "0" or "1"), obtained e.g., at the output of the logic element LL. By receiving the feedback signal and the input signal IN, the control logic CL may detect a change in the translated output signal e.g., to refresh the output data. Depending on whether the output signal is consistent or not consistent with the input signal, the refresh operation either confirms or corrects the output.

In one or more embodiments, fast operation may be facilitated (the faster the feedback, the higher the frequency of the signals that can be handled) by providing to the level-shifter an input signal equal to the input signal provided in case of an IN edge (consistent with actual IN value).

This refresh operation produces a positive correction in the high voltage output in the case of inconsistency, while no alteration is produced in the case of consistency.

Different implementations of the control logic CL are possible with the logic CL capable of receiving the feedback signal, checking it against the expected value and reconfirming it (only) if the two differ.

Similarly, while certain exemplary implementations of the feedback path 10, the control logic CL, and the level translator LT will now be described by way of example, other implementations may be devised by those of skill in the art.

Figure 2:
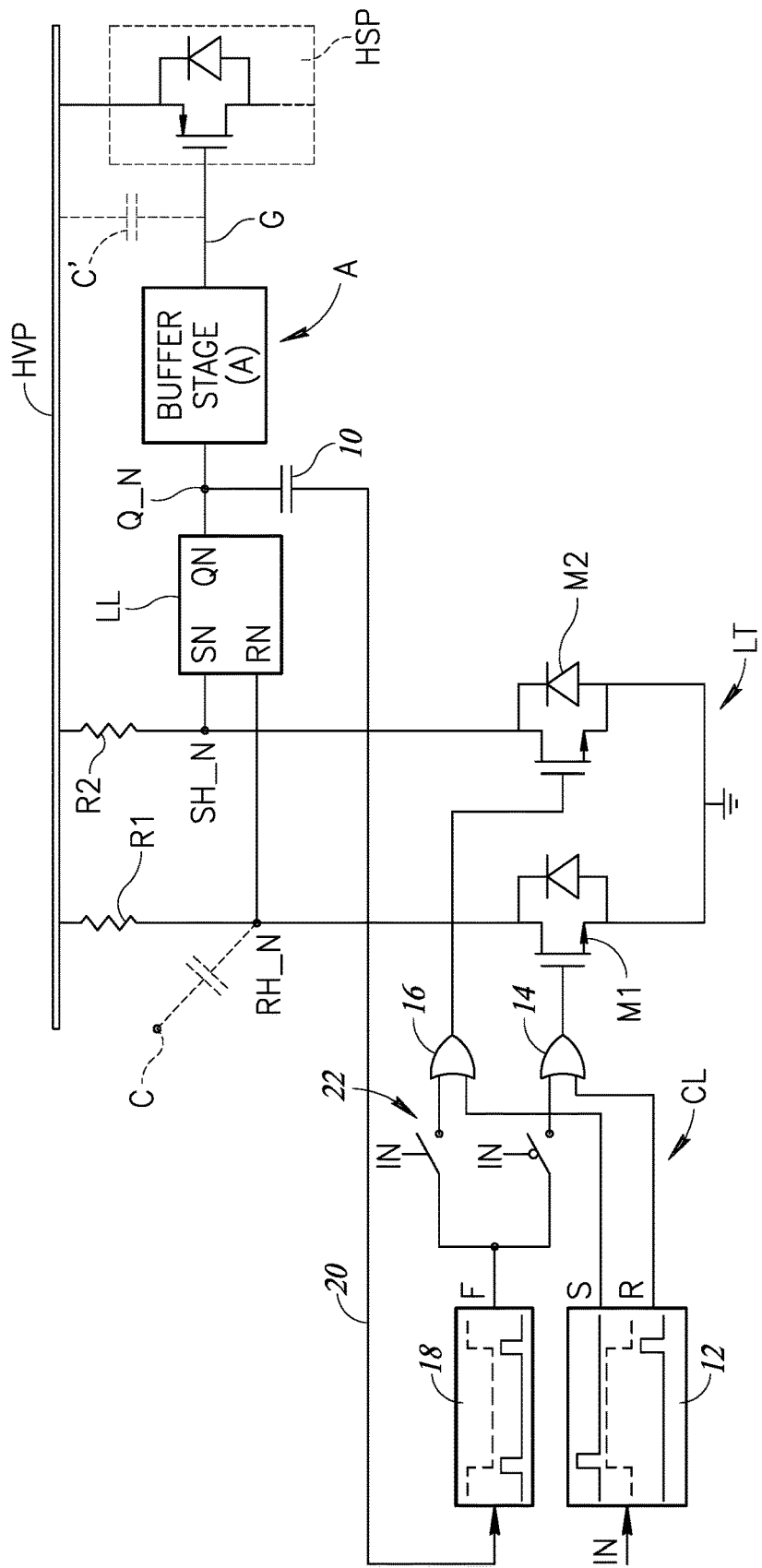
FIG. 2 is a circuit diagram exemplary of embodiments.

For instance, one or more embodiments as exemplified in the circuit diagram of FIG. 2 may include:
- a capacitive feedback path, including a capacitor 10, which may have a very small (notionally zero) static power consumption,
- a level translator LT including a switching stage set between HVP and ground (e.g., electronic switches such as MOSFETs M1, M2 with drain resistors R1, R2), and
- a pulse driven latch LL.

In one or more embodiments, the input IN going from 1 to 0 may cause a monostable circuit 12 in the control logic CL to generate a pulse at an output node R. This pulse may be applied (e.g., via an OR gate 14 discussed in the following) to the control electrode (gate) of M1, thus turning M1 on (that is, making it conductive) for the pulse time, while M2 remains off (that is, nonconductive).

The resulting current through R1 thus generates a voltage drop proportional to its resistance value and the current intensity.

The voltage RH_N at the node between M1 and R1 will thus go "low" for the duration of the current pulse and then go back high, while the voltage SH_N at the node between M2 and R2 will remain "high" (e.g., at HVP).

In one or more embodiments, the logic element LL may include an equivalent set-reset latch having input ports SN and RN sensitive to the voltages RH_N and SH_N as well as an output port QN to provide an output signal Q_N.

In one or more embodiments, the logic element LL may be configured according to the truth table shown below.

| SN | RN | QN |
|----|----|------|
| 0  | 0  | Latch |
| 0  | 1  | 0    |
| 1  | 0  | 1    |
| 1  | 1  | Latch |

Under the conditions portrayed above, the logic element LL may thus react and then have its output QN, that is the line/node ("net") Q_N towards the load HSP set to a "high" value e.g., HVP.

The signal at node Q_N (hereinafter, briefly, the signal Q_N) may be propagated towards the load HSP (e.g., through the stage A) in order to produce e.g., a signal at a node G coupled to the control electrode (e.g., gate) of a PMOS in the load HSP.

By way of non-limiting feature, in one or more embodiments as exemplified herein, the stage A may include a logical inversion so that (see the chronograms or signal timing diagrams in FIG. 3) Q_N going upward from "low" to "high" (e.g., from REF_HVP to HVP) may result in G switching downward from "high" to "low" (e.g., from HVP to REF_HVP) possibly with a front speed limited by its large parasitic capacitive load (output MOSFETs may in fact be bulky in order to be able to withstand large output currents).

In one or more embodiments, the signal Q_N will also propagate towards the control logic CL over the feedback path including e.g., a single capacitor 10.

In one or more embodiments, the capacitor 10 may be pre-charged at a pre-charge value (this may occur in a manner known per se).

Switching of the node Q_N coupled with one end of the capacitor 10 is thus "reported" from the node Q_N to the low voltage level over the line 20. A voltage variation at the one end of the capacitor 10 coupled with the node Q_N will be mirrored by a corresponding voltage variation at the other end of the capacitor 10 which is coupled to the input of a further monostable circuit 18 in the control logic CL.

The rising edge at the input of the monostable circuit 18 will produce at the output (node F) of the circuit 18 a voltage pulse. The pulse at node F is applied to a switch 22 sensitive to the state (that is the logic value) of the input signal IN to be forwarded towards the control electrode (e.g., gate) of either M1 or M2 depending on the state of IN.

In the exemplary case just considered (a pulse at the output node R applied by the monostable circuit 12 to the first input of the OR gate 14 as a result of the input IN going from 1 to 0), the switch 22 will direct the pulse at node F towards the other input of the OR gate 14, e.g., via the lower contact of the switch 22 being closed, that is, made conductive by the logical complement of IN. Such a pulse directed from the node F towards the other input of the OR gate 14 creates a new pulse to 0 on RH_N that confirms the status in the node Q_N (that is, the level of Q_N is maintained at "1" and the transitions end).

As further detailed in connection with the chronograms or signal timing diagrams of FIG. 3 a thoroughly similar operation may be achieved in the case where IN switches from 0 to 1.

In that case, in one or more embodiments, the input IN going from 0 to 1 may cause the monostable circuit 12 in the control logic CL to generate a pulse at an output node S. This pulse may be applied (via an OR gate 16) to the control electrode (gate) of M2, thus turning M2 on (that is, making it conductive) for the pulse time, while M1 remains off (that is, non-conductive).

Save for certain logical values being possibly inverted (see e.g., FIG. 3), operation of the logic element LL and of the feedback path 10 will thus be essentially similar to the one described previously, with the capacitor 10 "reporting" a feedback signal from the node Q_N to the low voltage level and the switch 22 directing the pulse at node F towards the OR gate 16 (e.g., via the upper contact of the switch 22 being closed, that is, made conductive by IN). Such a pulse directed from the node F towards the OR gate 16 creates a new pulse to 0 on SH_N that confirms the status in the node Q_N (that is, the level of Q_N is maintained at "0" and the transitions end).

It will be appreciated that one or more embodiments:
may be notionally exempt from static consumption insofar as the level translator LT may be implemented as a switching stage (e.g., somewhat akin to a rectifier) including electronic switches such as MOSFETs M1, M2 driven by current pulses, with current consumption occurring primarily during switching, with the other logical blocks switching only during such switching occurs,
may provide high immunity to noise and other disturbances through feedback.

Figure 3:
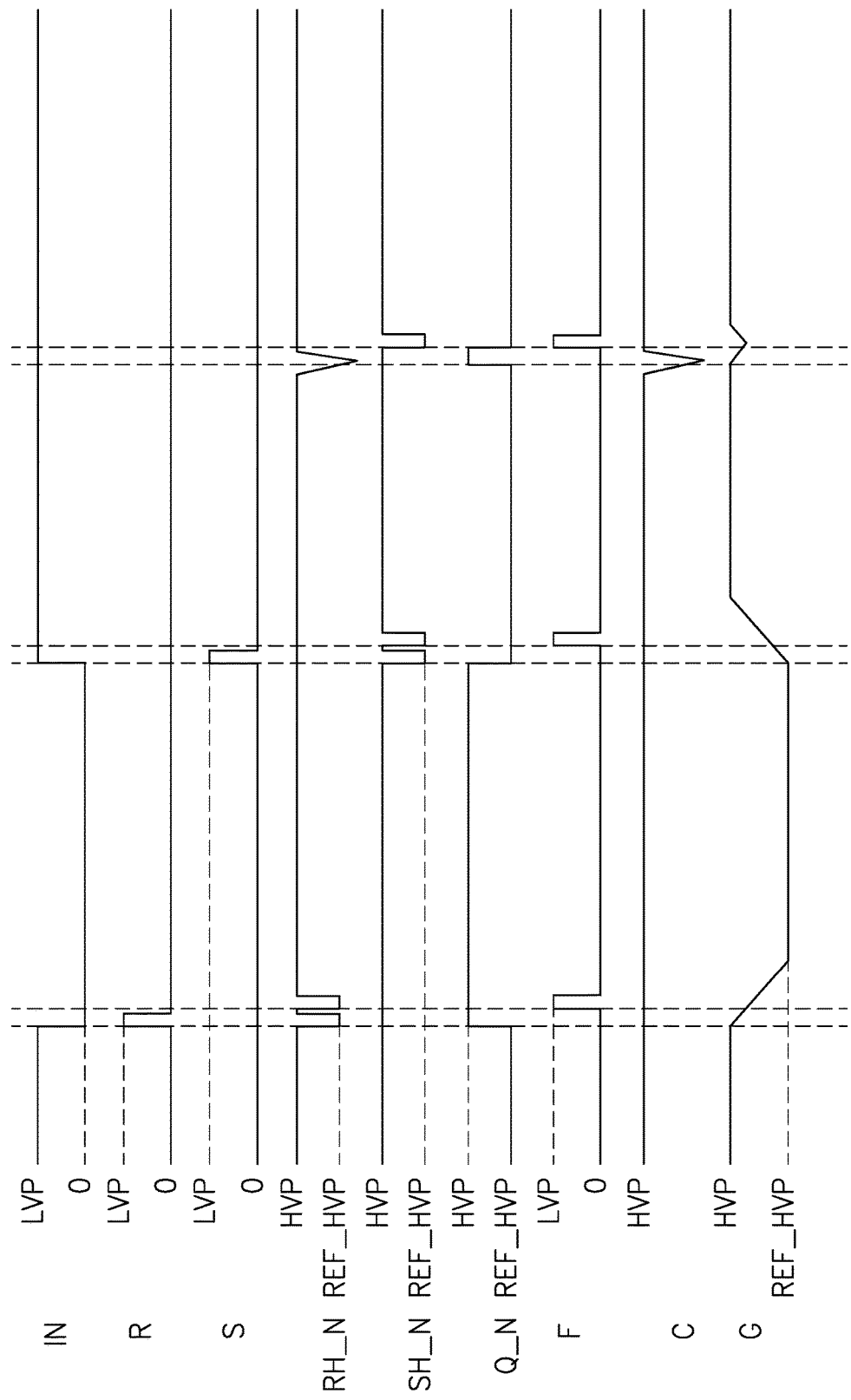
FIG. 3 is illustrative of certain signals exemplary of possible operation of embodiments.

The chronograms or signal timing diagrams of FIG. 3 portray possible time behaviors of the input signal IN and the signals at the nodes R, S (outputs from the monostable circuit 12), RH_N, SH_N (outputs from the level translator stage LT), Q_N (output from the logic element LL), F, G plus an exemplary disturbance signal (e.g., downward spike) from a parasitic coupling e.g., between a node C and RH_N (see the capacity illustrated in dashed lines in FIG. 2).

The left side of FIG. 3 is exemplary of "regular" operation as discussed previously, e.g., switching of IN from "1" (e.g., LVP) to "0" (e.g., ground or zero voltage) or vice-versa producing a correlated, consistent switching of Q_N (and G) e.g., between HVP and REF_HVP, which is confirmed e.g., by a "refresh" action as exemplified by the second downward pulse over RH_N or SH_N.

The right side of FIG. 3 is exemplary of possible operation of one or more embodiments in the presence of a disturbance as exemplified by the downward spike C as discussed previously.

If of sufficient amplitude, that pulse may be read as a logic "0" at the RN input of LL. This might cause the node Q_N to switch (see the related chronogram or signal timing diagram in FIG. 3). Such switching will again be "reported" towards the control logic CL via the feedback path (e.g., the capacitor 10) so that the monostable circuit 18 generates a pulse at node F.

Since, in the case exemplified in FIG. 3, IN=1 (no switching of IN when the spike C occurs) the pulse on F will be directed to the control terminal (gate) of M2 (e.g., via the upper contact of the switch 22 being closed, that is, made conductive by IN), thus forcing SH_N to 0 (e.g., REF_HVP). This will cause switching of the node Q_N back to 0, which is the desired value.

Considering the parasitic capacitive load at the node G (as schematically represented by the capacitor C' in dashed lines in FIGS. 1 and 2) and the speed of action of the feedback path 10, the short pulse on Q_N (e.g., "0" to "1" and back to "0"), while propagating towards the node G will be unable to develop a voltage sufficient to modify the level on the load HSP (e.g., to turn on the PMOS therein).

Absent the feedback path 10, a (stable) switch may have occurred in the value of Q_N, with Q_N possibly remaining at a wrong value until a new switching of IN (which might possibly occur only after long). Such a situation may result e.g., in a PMOS in the load HSP actually intended to be in an "off" state, being turned on erroneously and without control, with the risk of undesirably generating output currents which may lead to unexpected power consumption and/or turn out to be harmful to the device or other unexpected consumption.

In applications intended for driving small loads, e.g., small output MOSFETs, the path from Q_N to G may provide a correspondingly low capacitive load, thus providing a reduced filtering action of the pulses due to disturbances (e.g., C) propagating over the path between Q_N and G so that the disturbance pulse might produce a corresponding spike or ON-ON current at the output for the duration of that pulse.

One or more embodiments may address this issue by positively providing a filter (e.g., low-pass) in the path between Q_N and G e.g., in the stage A, such filter being dimensioned in order to avoid the propagation of the pulse to G for the time during which the feedback path provides the correction of Q_N as exemplified in the foregoing.

It will otherwise be appreciated that the embodiments are not limited to those arrangements where, as exemplified herein, switching of IN from "1" to "0" results in Q_N switching from "0" to "1" and switching of IN from "0" to "1" results in Q_N switching from "1" to "0" (that is with a logical inversion from input to output).

In one or more embodiments switching of IN from "1" to "0" may result in Q_N identically switching from "1" to "0" while switching of IN from "0" to "1" may result in Q_N switching from "0" to "1" (that is with no logical inversion from input to output).

Stated otherwise, in one or more embodiments "consistency" or "correlation" between input (e.g., IN) and output (e.g., Q_N) may be found to exist when output switching properly "matches" input switching, that when output switching occurs as desired because input switching has occurred, independently of the logical values involved.

Similarly, while "upward" level shifting (e.g., from a low voltage LVP to a high voltage HVP) has been exemplified herein, one or more embodiments may apply to "downward" level shifting, e.g., from a low voltage to a (negative) high voltage.

Similarly, the logic inversion relationship between Q_N and G as exemplified herein is in no way mandatory.

Adapting the exemplary arrangements disclosed herein to a different input-to-output logical relationship and/or to downward level shifting falls within the skills of experts in this area thus making it unnecessary to provide a detailed description herein.

One or more embodiments may thus provide a level shifter circuit for driving a load (e.g., HSP) via a power supply line HVP, the circuit including:
- an input stage for receiving an input signal (e.g., IN) switchable between a first and a second input level (e.g., 0, LVP),
- an output stage coupled to said power supply line to produce a drive signal (e.g., G, as possibly obtained from Q_N via the stage A) for said load, the output stage switchable between a first and a second output level (e.g., REF_HVP, HVP),
- a level translator set between the input stage and the output stage, whereby said input signal switching between said first and second input levels translates into said output stage switching between said first and second output levels (that is, switching of the input signal between first and second input levels causes the output stage to correspondingly switch between said first and second output levels),
- a feedback element (e.g., 10) coupled to said output stage for transferring to said input stage a feedback signal (e.g., 20) representative of the output level (e.g., Q_N) of the output stage,
- wherein the input stage includes control circuitry (e.g., 12 to 18, 22) sensitive to said input signal and said feedback signal for detecting undesired switching of said output stage between said first and second output levels occurring in the absence of input signal switching between said first and second input levels, said control circuitry configured (e.g., 22) for inverting (e.g., changing from 0 to 1 or from 1 to 0) the output level of said output stage resulting from said undesired switching.

In one or more embodiments, said control circuitry sensitive to said input signal is configured for detecting switching of said output stage between said first and second output levels occurring as a result of input signal switching between said first and second input levels (0, and refreshing (see e.g., the second downward pulses on RH_N and SH_N in the diagrams of FIG. 3) the output level resulting from such switching.

In one or more embodiments, the said feedback element may include a capacitor (e.g., 10) set between said output stage and said control circuitry.

One or more embodiments may include an upward level translator set between an input stage for receiving an input signal switchable between first and second low-voltage input levels (e.g., 0, LVP) and an output stage for producing a high-voltage drive signal (e.g., REF_HVP, HVP) for said load.

One or more embodiments may include a downward level translator set between a low-voltage input stage and a negative high-voltage output stage.

In one or more embodiments said level translator may include a switching stage, optionally including electronic switches such as MOSFETs (e.g., M1, M2).

In one or more embodiments said output stage may include a set-reset latch element (e.g., LL) having set and reset inputs (e.g., SN, RN) coupled (e.g., SH_N, RH_N) to said level translator and an output switchable between said first and second output levels (e.g., REF_HVP, HVP) as a function of said set and reset inputs.

In one or more embodiments, said control circuitry may include:
- a pulse circuit (e.g., 18) driven by said feedback signal, said pulse circuit coupleable (e.g., via 14, 16, 22) to said level translator to apply to said level translator drive pulses (e.g., F) for switching said output stage between said first and second output levels,
- a coupling circuit (e.g., 22) set between said pulse circuit and said level translator, said coupling circuit sensitive to said input signal (IN) to selectively couple said pulse circuit to said level translator (LT) in a coupling condition for applying to said level translator drive pulses (e.g., F) for inverting the output level of said output stage resulting from said undesired switching of said output stage.

In one or more embodiments, said coupling circuit (e.g., 22) may admit a further coupling condition to couple said pulse circuit to said level translator to apply to said level translator drive pulses for maintaining the output level (e.g., Q_N) of said output stage at one of said first and second output levels translating said input signal switching between said first and second input levels.

In one or more embodiments, said output stage (e.g., A) may include a filter, optionally of the low-pass type, to produce said drive signal (e.g., G) for said load.

Without prejudice to the underlying principles, the details and embodiments may vary, even significantly, with respect to what has been described by way of example only without departing from the extent of protection.

The extent of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A level shifter circuit for driving a load via a power supply line, the level shifter circuit comprising:
- an input stage for receiving an input signal switchable between a first and a second input level;
- an output stage coupled to said power supply line to produce a drive signal for said load, the output stage switchable between a first and a second output level;
- a level translator coupled between the input stage and the output stage, wherein said input signal switching between said first and second input levels causes said output stage to switch between said first and second output levels;

a feedback element coupled to said output stage for transferring to said input stage a feedback signal representative of the output level of the output stage; and control circuitry sensitive to said input signal and said feedback signal and configured for detecting undesired switching of said drive signal between said first and second output levels occurring in the absence of a switching of the input signal between said first and second input levels and inverting the output level of said drive signal resulting from said undesired switching, the control circuitry including:

a pulse circuit driven by said feedback signal, said pulse circuit coupleable to said level translator to apply to said level translator drive pulses for switching said output stage between said first and second output levels, a coupling circuit coupled between said pulse circuit and said level translator, said coupling circuit sensitive to said input signal to couple said pulse circuit in a coupling condition to said level translator to apply to said level translator drive pulses for inverting the output level of said output stage resulting from said undesired switching of said output stage.

2. The level shifter circuit of claim 1, wherein said control circuitry sensitive to said input signal is configured for detecting switching of said output stage between said first and second output levels occurring as a result of input signal switching between said first and second input levels and refreshing the output level resulting from said input signal switching.

3. The level shifter circuit of claim 1, said feedback element includes a capacitor coupled between said output stage and said control circuitry.

4. The level shifter circuit of claim 1, including a level translator coupled between an input stage for receiving an input signal switchable between first and second low-voltage input levels and an output stage for producing a high-voltage drive signal for said load.

5. The level shifter circuit of claim 1, wherein said level translator includes a switching stage including electronic switches.

6. The level shifter circuit of claim 5, wherein the electronic switches comprise MOSFET transistors.

7. The level shifter circuit of claim 1, wherein said output stage includes a latch element having inputs coupled to said level translator and an output switchable between said first and second output levels as a function of said inputs.

8. The level shifter circuit of claim 1, wherein said coupling circuit admits a further coupling condition to couple said pulse circuit to said level translator to apply to said level translator drive pulses maintaining the output level of said output stage at one of said first and second output levels resulting from said input signal switching between said first and second input levels.

9. The level shifter of claim 1, wherein said output stage includes a filter, preferably of the low-pass type, to produce said drive signal for said load.

10. An electronic system, comprising:
a level shifter circuit including,
an input circuit configured to receive an input signal switchable between a first input level and a second input level and configured to generate a control signal responsive to the input signal;
a level translator circuit coupled to the input circuit and configured to generate a level shifted control signal switchable between a first output level and a second output level responsive to the control signal from input circuit;
an output circuit coupled to the level translator and configured to generate a first drive signal switchable between the first output level and the second output level responsive to the level-shifted control signal;
a feedback circuit coupled between the output circuit and the input circuit and configured to generate a feedback signal indicating a change in the level of the first drive signal from the output circuit, the feedback circuit further configured to detect an inconsistency between the level of the input signal and the level of the first drive signal and to generate the control signal to cause the level translator circuit and output circuit to generate the first drive signal having the proper level corresponding to the level of the input signal, the feedback circuit including:
a pulse generation circuit configured to generate an output pulse responsive to a transition of first drive signal; and
logic circuitry coupled to receive the output pulse and configured to generate the control signal causing the level translator circuit to generate the level shifted control signal that causes the output circuit to drive the first drive signal to the level corresponding to the level of the input signal; and
load circuitry coupled to the output circuit.

11. The electronic system of claim 10, wherein the load circuitry comprises ultrasound circuitry including an ultrasound pulser.

12. The electronic system of claim 10, wherein the feedback circuit further comprise a capacitor coupled between the output circuit and the input circuit, the feedback signal being generated by the capacitor responsive to a change in the level of the first drive signal.

13. The electronic system of claim 10, wherein the output circuit further comprises:
an RS latch having set and reset inputs coupled to the level translator the level shifted control signal and having an output coupled to the capacitor; and
a buffer coupled between the output of the RS latch and the load circuitry.

14. The electronic system of claim 13, wherein the buffer comprises an inverting buffer.

15. A method, comprising:
receiving an input signal switchable between a first and a second input level;
generating one a drive node a drive signal in response to the input signal, the drive signal switchable between a first and a second output level different from the first and second input level;
capacitively coupling the drive node to a feedback node;
generating on the feedback node a feedback signal responsive to a transition of the drive signal;
generating a pulse signal in response to the feedback signal;
detecting undesired switching of said drive signal between said first and second output levels occurring in the absence of a switching of the input signal between said first and second input levels; and
inverting the level of said drive signal in response to the pulse signal if detecting said undesired switching.

16. The method of claim 15, wherein receiving the input signal comprises generating a pulse signal responsive to transitions of the input signal between the first and the second input levels.

17. The method of claim 16, wherein generating on the drive node the drive signal in response to the input signal comprises:
- generating at least one level shifted control signal in response to the input signal, the level shifted control signal being switchable between the first and second output levels; and
- generating the drive signal in response to the at least one level shifted control signal.

18. The method of claim 17, wherein detecting undesired switching of said drive signal comprises controlling switching of the pulse signal based on the input signal.

* * * * *